(12) United States Patent
Seike

(10) Patent No.: US 7,068,063 B2
(45) Date of Patent: Jun. 27, 2006

(54) OUTPUT BUFFER CIRCUIT

(75) Inventor: Toshimichi Seike, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 39 days.

(21) Appl. No.: 10/752,010

(22) Filed: Jan. 7, 2004

(65) Prior Publication Data
US 2004/0135597 A1    Jul. 15, 2004

Related U.S. Application Data

(62) Division of application No. 10/194,297, filed on Jul. 15, 2002, now Pat. No. 6,720,794.

(30) Foreign Application Priority Data
Jul. 16, 2001  (JP) .............................. 2001-215376

(51) Int. Cl.
*H03K 19/003* (2006.01)

(52) U.S. Cl. .............................. 326/27; 326/26; 326/83

(58) Field of Classification Search ............ 326/21–27, 326/82–83; 327/108, 112
See application file for complete search history.

(56) References Cited

U.S. PATENT DOCUMENTS

| | | | |
|---|---|---|---|
| 4,612,466 A | | 9/1986 | Stewart |
| 5,013,940 A | * | 5/1991 | Ansel ........................... 326/27 |
| 5,430,387 A | * | 7/1995 | Bechade et al. .............. 326/27 |
| 5,623,221 A | * | 4/1997 | Miyake ....................... 327/108 |
| 5,654,648 A | | 8/1997 | Medhekar et al. |
| 5,804,990 A | * | 9/1998 | Popat et al. ................. 326/114 |

* cited by examiner

*Primary Examiner*—Anh Q. Tran
(74) *Attorney, Agent, or Firm*—Volentine Francos & Whitt, PLLC

(57) ABSTRACT

An output buffer circuit includes first and second inverters connected to an input terminal for outputting signals having a slow rise up and fall down characteristic; a pull up control circuit that pulls up an output voltage of the first inverter and stops the pull up operation based on a level of the output signal of the first inverter; and a pull down control circuit that pulls down an output voltage of the second inverter and stops the pull down operation based on a level of the output signal of the second inverter. A first output transistor has a source connected to a first power source, a drain connected to the output terminal and a gate connected to the first inverter. A second output transistor has a source connected to a second power source, a drain connected to the output terminal and a gate connected to the second inverter.

8 Claims, 6 Drawing Sheets

OUTPUT BUFFER CIRCUIT

CROSS REFERENCE TO RELATED APPLICATIONS

This is a divisional application of application Ser. No. 10/194,297, filed Jul. 15, 2002 now U.S. Pat. No. 6,720,794, which is hereby incorporated by reference in its entirety for all purposes.

BACKGROUND OF THE INVENTION

The present invention relates to an output buffer circuit provided in a semiconductor integrated circuit (hereinafter, referred to as an IC).

A usual output buffer circuit is constituted by a complementary MOS transistor (hereinafter, referred to as CMOS) IC. An inverter is connected to an input terminal receiving an input signal. The inverter includes a P-channel type MOS transistor (hereinafter, referred to as PMOS) and an N-channel type MOS transistor (hereinafter, referred to as NMOS) which are connected in series between a power source potential VDD node and a ground potential VSS node (i.e., ground).

In designing an output buffer circuit, it is necessary to consider DC characteristics such as an output voltage and an output current of an output signal OUT. In order to satisfy the characteristics of the output voltage and output current, the PMOS and the NMOS are generally designed as large elements. However, when the PMOS and the NMOS have a large element size, rise and fall of the input signal IN causes a high-speed change of the rise and fall of the output signal OUT, generating an output waveform overshoot and undershoot. Moreover, for a short period of time, the PMOS and the NMOS simultaneously become an ON state, and a through current from the power source potential VDD to the ground potential VSS increases, causing problems that the power consumption increases and the power source noise also increases.

Thus, in the conventional output buffer circuit, it is difficult to suppress the change of the output signal OUT to a low speed while satisfying the DC characteristic.

SUMMARY OF THE INVENTION

It is therefore an object of the present invention to provide an output buffer circuit capable of suppressing the output signal change to a low speed while satisfying the DC characteristic.

According to the present invention, there is provided an output buffer circuit comprises an input terminal, an output terminal first and second inverters, a pull up control circuit, a pull down control circuit and first and second output transistors. Each of the first and second inverters is connected to the input terminal for outputting a signal having a slow rise up and fall down characteristic. Both of the pull up and pull down control circuits are connected to the input terminal and the output terminal. The pull up control circuit pulls up an output voltage of the first inverter when the output signal of the first inverter has a level lower than a first threshold voltage level. The pull up control circuit stops the pull up operation when the level of the output signal of the first inverter exceeds the first threshold voltage level. The pull down control circuit pulls down an output voltage of the second inverter when the output signal of the second inverter has a level higher than a second threshold voltage level. The pull down control circuit stops the pull down operation when the pull down control circuit becomes lower than the second threshold voltage level. The first output transistor has a source connected to a first power source, a drain connected to the output terminal and a gate connected to the first inverter. The second output transistor has a source connected to a second power source, a drain connected to the output terminal and a gate connected to the second inverter.

DETAILED DESCRIPTION OF THE PREFERRED EMBODIMENTS

Figure 1:
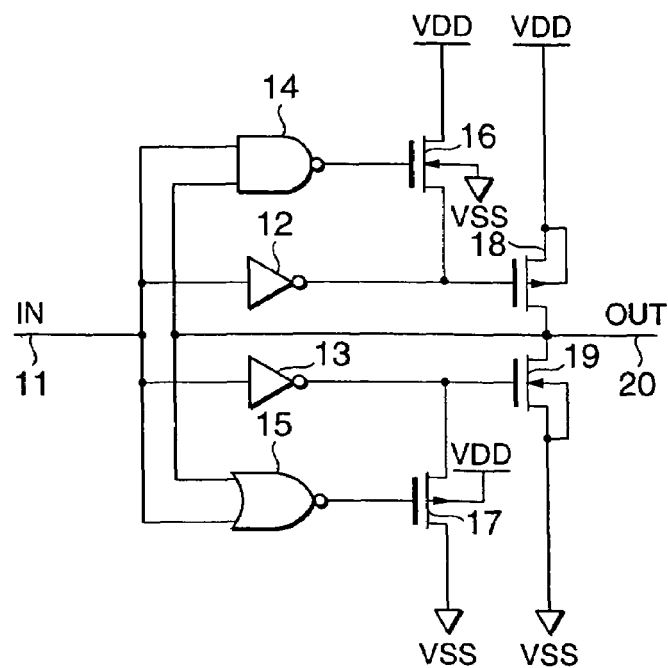
FIG. 1 is a circuit diagram of an output buffer circuit according to a first embodiment of the present invention.

FIG. 1 is a circuit diagram of an output buffer circuit according to a first embodiment of the present invention.

This output buffer circuit is constituted by, for example, CMOS IC and has an input terminal 11 for inputting an input signal IN and this input terminal is connected to input terminals of a first and a second inverter 12 and 13. The input terminal 11 and an output terminal 20 for outputting an output signal OUT are connected to an input terminal of a 2-input NAND gate 14. The NAND gate 14 has an output terminal connected to a gate of an NMOS 16 for pull-up. The NMOS 16 has a drain connected to a first power source potential node (for example, power source potential VDD node), a source connected to an output side node N12 of the inverter 12, and a back gate connected to a second power source potential node (for example, ground potential VSS node).

The NAND gate 14 and the NMOS 16 constitute pull up control means. When the output signal OUT voltage is lower than a first threshold value voltage VT14 of the NAND gate 14, the pull up control means pulls up the voltage of the output side node N12 of the inverter 12, and when the output signal OUT voltage exceeds the first threshold value voltage VT14, the pull up control means stops pull up of the voltage of the node N12 according to the input signal IN.

The input terminal 11 and the output terminal 20 are connected to an input terminal of 2-input NOR gate 15 and an output terminal of this NOR gate 15 is connected to a gate of PMOS 17 for pull down. The PMOS 17 has a source connected to the output side node N13 of the inverter 13, a drain connected to the ground potential VSS node, and a back gate connected to the power source potential VDD node.

The NOR gate 15 and the PMOS 17 constitute pull down control means. When the output signal OUT voltage exceeds a second threshold value voltage VT15, the pull down control means pulls down the voltage of the output side node N13 of the inverter 13 and when the output signal OUT voltage becomes lower than the threshold value voltage VT15, the pull down control means stops pull down of the voltage of the node N13 according to the input signal IN.

The NMOS 16 for pull up and the PMOS 17 for pull down are designed to have a large ON resistance in an ON state.

The node N12 is connected to a gate of a first output transistor (for example, PMOS for output) 18. The PMOS 18 has a source and a back gate connected to the power source potential VDD node and a drain connected to the output terminal 20. The node N13 is connected to a gate of a second output transistor (for example, NMOS for output) 19. The NMOS 19 has a drain connected to the output terminal 20 and a source and a back gate connected to the ground potential VSS node.

Figure 2:
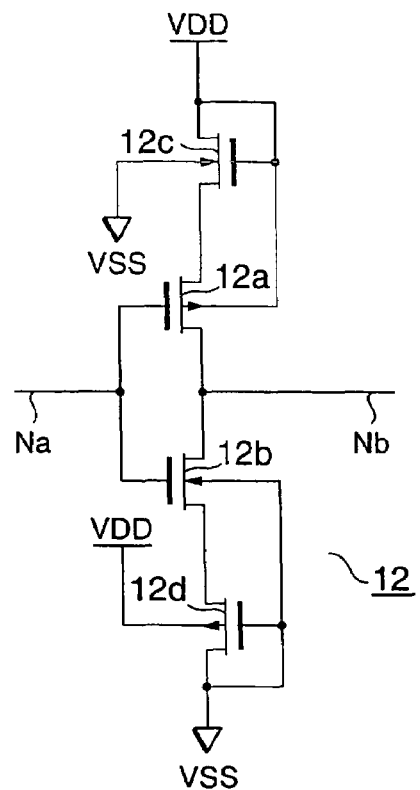
FIG. 2 is circuit diagram showing a configuration example of an inverter shown in FIG. 1.

FIG. 2 is a circuit diagram showing a configuration example of the inverter 12 in FIG. 1.

The inverter 12 has an input node Na connected to the input terminal 11 in FIG. 1 and this input node Na is connected to a gate of a first conductive type first MOS transistor (for example, PMOS) 12a and a gate of a second conductive type second MOS transistor (for example, NMOS) 12b. The PMOS 12a has a drain connected to the output node Nb, a source connected to a source of a first transistor (for example, NMOS) 12c, and a back gate connected to the power source potential VDD node. The NMOS 12c has a gate and a drain connected to the power source potential VDD node and a back gate connected to the ground potential VSS node. This NMOS 12c is diode-connected and the voltage fall (that is, threshold value voltage) is VTn.

The NMOS 12b has a drain connected to the output node Nb, a source connected to a source of a second transistor (for example, PMOS) 12d, and a back gate connected to the ground potential VSS node. The PMOS 12d has a drain and a gate connected to the ground potential VSS node and a back gate connected to the power source potential VDD node. This PMOS 12d is diode-connected and the voltage fall (that is, the threshold value voltage) is VTp.

The inverter 13 in FIG. 1 has identical circuit configuration as the inverter 12 in FIG. 2.

Figure 3:
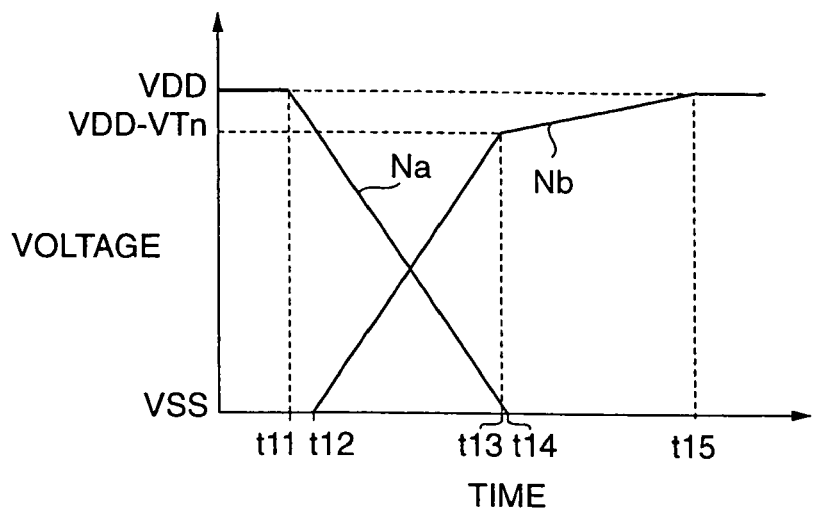
FIG. 3 is a voltage waveform diagram showing operation of FIG. 2.
Figure 4:
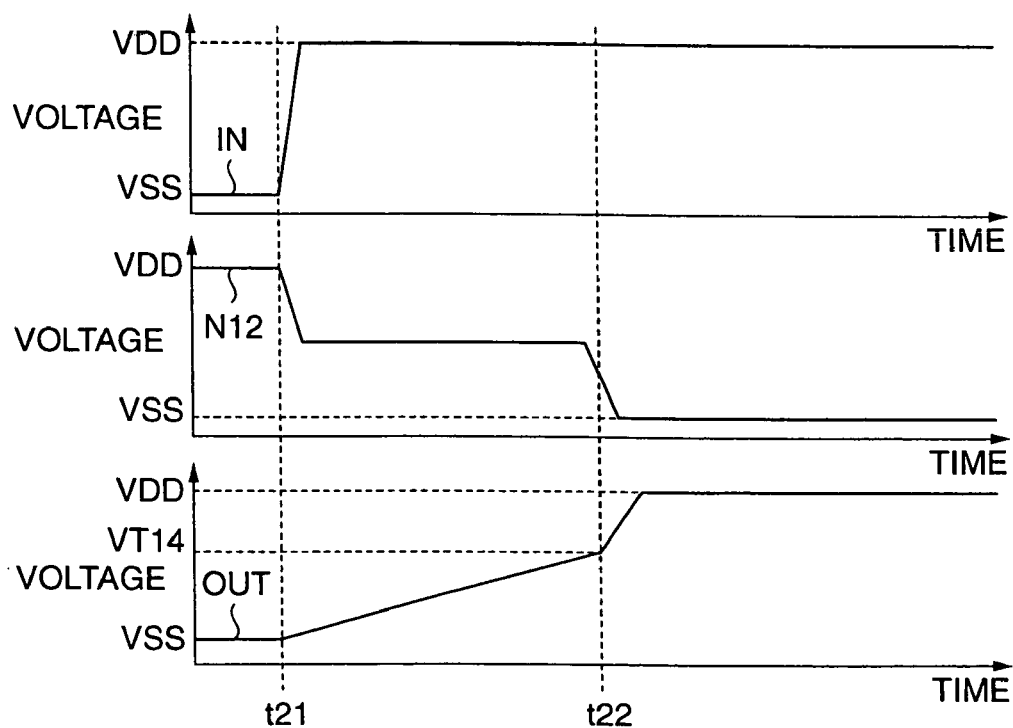
FIG. 4 is a voltage waveform diagram showing operation of FIG. 1.

FIG. 3 is a voltage waveform diagram showing operation of the inverter of FIG. 2. Furthermore, FIG. 4 is a voltage waveform diagram showing operation of the output buffer circuit of FIG. 1.

For example, when the voltage of the input signal IN supplied to the input terminal 11 in FIG. 1 falls down from the "H" level (=VDD) to the "L" level (=VSS), the output side nodes N12 and N13 of the inverters 12 and 13 rise up.

That is, in the inverter 12 of FIG. 2, as shown in FIG. 3, when the input signal IN voltage (voltage of the input node Na) falls from the "H" level to the "L" level from time t11 to time T14, the PMOS 12a becomes an ON state and the NMOS 12b becomes an OFF state. Here, the potential difference between the source of the PMOS 12a and the power source potential VDD is not smaller than the threshold value voltage VTn of the NMOS 12c and accordingly, at time t12, a large current flows in the diode-connected NMOS 12c and the voltage of the output node Nb rises up rapidly via the PMOS 12a.

At time t13, when voltage of the output node Nb becomes (VDD–VTn), the source voltage of the PMOS 12a becomes equal to voltage (VDD–VTn). Accordingly, almost no current flows in the NMOS 12c and voltage of the output node Nb slowly rises up to the power source potential VDD. That is, after time t13, the potential difference applied to the NMOS 12c is not greater than the threshold value voltage VTn. Actually, however, leak current flows in this NMOS 12c and this leak current slowly increases the voltage of the output node Nb and the voltage reaches the power source potential VDD at time t15.

Thus, when the voltage of the input node Na falls from the "H" level to the "L" level, the voltage of the output node Nb rapidly increases to the (VDD–VTn) and slowly increases from this voltage (VDD–VTn) to the power source potential VDD. The inverter 13 of FIG. 1 also operates in the same way as this inverter 12.

Moreover, when the input signal IN of FIG. 1 rises from the "L" level up to the "H" level, the PMOS 12a becomes the OFF state and the NMOS 12b becomes the ON state. Here, the potential difference between the source of the NMOS 12b and the ground potential VSS is not smaller than the threshold value voltage VTp of the PMOS 12d and accordingly, a large current flows in the diode-connected PMOS 12d and the voltage of the output node Nb rapidly falls down to VTp. When the voltage of the output node Nb becomes VTp, almost no current flows in the PMOS 12d and a leak current flowing in this PMOS 12d slowly lowers the voltage of the output node Nb down to the ground potential VSS.

Thus, voltage of the output node Nb rapidly falls from the power source potential VDD down to the voltage VTp and slowly falls from the voltage VTp down to the ground potential VSS. The inverter 13 of FIG. 1 also operates in the same way as this inverter 12.

Next, explanation will be given on the entire operation of the output buffer circuit of FIG. 1 with reference to FIG. 4.

For example, when the input signal IN voltage rises from the "L" level (=VSS) up to the "H" level (=VDD) at time t21, the output side nodes N12 and N13 of the inverters 12 and 13 fall down to the "L" level, and the PMOS 18 becomes the ON state and The NMOS 19 becomes the OFF state. Since the output signal OUT voltage is at "L" level when the output side node N12 of the inverter 12 falls down to the "L" level, the output voltage of the NAND gate 14 is at "H" level and the node N12 is pulled up by the NMOS 16 in the ON state. For this, the voltage divided by the pull up of the NMOS 16 and the inverter 12 is supplied to the gate of the PMOS 18. Since the PMOS 18 supplied with the divided gate voltage has a small drive capacity, the output signal OUT voltage slowly increases to the "H" level via this PMOS 18.

When the output signal OUT voltage increases to the threshold value voltage VT14 of the NAND gate 14 at time t22 in FIG. 4, the output voltage of the NAND gate 14 becomes "L" level and the NMOS 16 becomes the OFF state. This stops the pull up operation of the NMOS 16 and the output side node N12 of the inverter 12 becomes completely "L" level. Accordingly, the drive capacity of the PMOS 18 becomes large and the voltage of the output signal OUT rapidly rises via this PMOS 18 up to the "H" level (=VDD).

Moreover, when the voltage of the input signal IN falls from the "H" level to the "L" level, the output side nodes N12 and N13 of the inverters 12 and 13 rise up to the "H" level and the PMOS becomes the OFF state and the NMOS 19 becomes the ON state. Here, since the voltage of the output signal OUT is at "H" level, the output voltage of the NOR gate 15 becomes "L" level and the PMOS 17 becomes the ON state. When the PMOS 17 becomes the ON state, the output side node N13 of the inverter 13 is in a pulled down state and the divided voltage by the pull down of the inverter 13 and the PMOS 17 is supplied to the gate of the NMOS 19.

Since the NMOS 19 supplied with the divided gate voltage has a small drive capacity, the voltage of the output signal OUT is slowly falls down to the "L" level. When the voltage of the output signal OUT becomes lower than the threshold value voltage V15 of the NOR gate 15, the output voltage of this NOR gate 15 becomes "H" level, the PMOS 17 becomes the OFF state, and the pull down operation stops. Thus, the output side node N13 of the inverter 13 becomes completely "H" level and the drive capacity of the NMOS 19 becomes large. The voltage of the output signal OUT rapidly falls down to become completely "L" level (=VSS).

In the output buffer circuit of the present embodiment, the NMOS 16 for pull up and PMOS 17 for pull down are designed to have a large ON resistance. The reason of this will be explained below.

In order to reduce the current flowing when dividing voltage between the inverters 12 and 13 and the NMOS 16 for pull up and the PMOS 17 for pull down, on resistance of the NMOS 16 and the PMOS 17 is set to a large value. Moreover, not only the current, but when the on resistance of the NMOS 16 and the PMOS 17 is set too small, the output voltage of the inverts 12 and 13 become lower than the threshold value voltage of the PMOS 18 and the NMOS 19 at the later stage and the circuit may not operate. Accordingly, the on resistance of the NMOS 16 and the PMOS 17 is set to a large value.

The inverter 12 of FIG. 2 includes the diode-connected NMOS 12*c* and PMOS 12*d* and accordingly, voltage of the output node Nb of this inverter 12, 13 slowly changes between the power source potential VDD and voltage (VDD−VTn) and between the ground potential VSS and the voltage VTp. For this, the voltage of the output signal OUT also changes slowly. Thus, it is possible to prevent generation of overshoot and undershoot of the output signal OUT.

In FIG. 1, by the pull up operation by the NMOS 16 and the pull down operation by the PMOS 17, firstly, the voltage of the output signal OUT slowly changes because the drive capacity of the PMOS 16 and the NMOS 17 is set small. After this, the pull up operation or the pull down operation is stopped and the drive capacity of the PMOS 18 and the NMOS 19 is set large so as to rapidly change the voltage of the output signal OUT. This can prevent through current flowing from the power source potential VDD via the PMOS 18 and the NMOS 19 to the ground potential VSS. This reduces the power consumption and prevents the power source noise.

Figure 5:
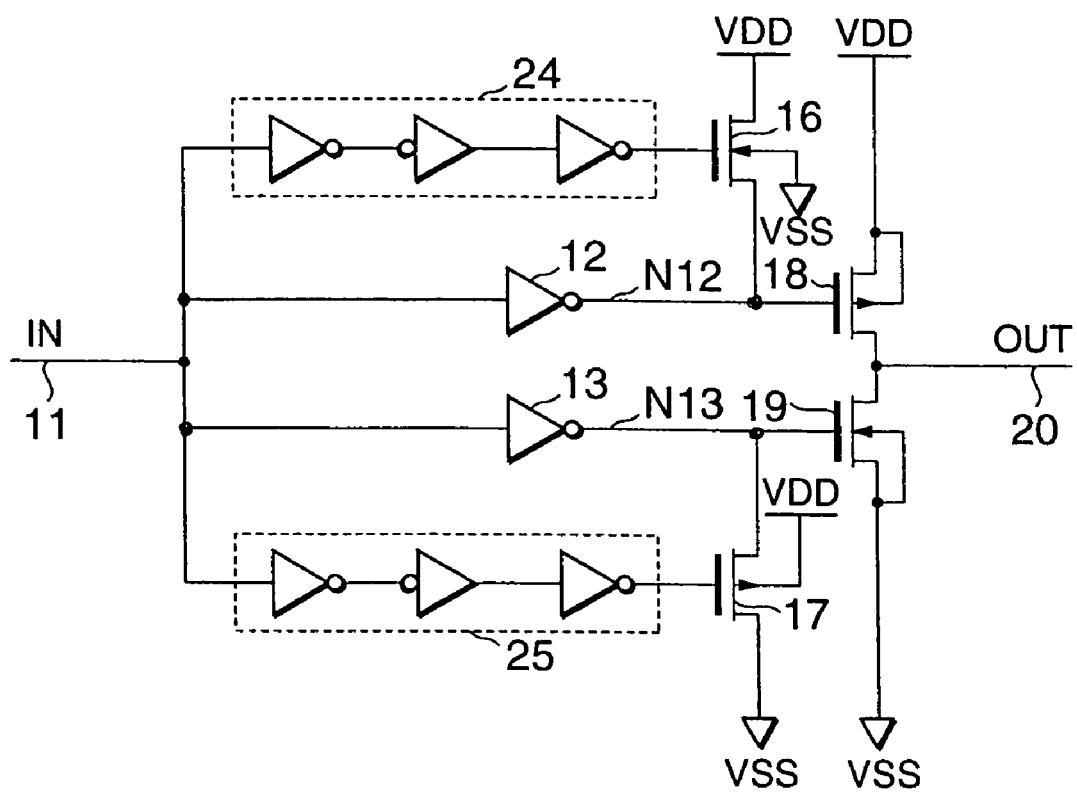
FIG. 5 is a circuit diagram of an output buffer circuit according to a second embodiment of the present invention.

FIG. 5 is circuit diagram showing an output buffer circuit according to a second embodiment of the present invention. Like components as in the first embodiment of FIG. 1 are denoted by like reference symbols.

This output buffer circuit is constituted, for example, by a CMOS IC and differs from the output buffer circuit of FIG. 1 in that the NAND gate 14 and the NOR gate 15 of FIG. 1 are replaced by delay circuits 24 and 25 having predetermined delay time values DT.

Each of the delay circuits 24 and 25 includes, for example, three-stage inverters connected in the longitudinal direction. The delay circuit 24 has an input terminal connected to the input terminal 11 and an output terminal connected to the gate of the NMOS 16 for pull up. The other delay circuit 25 has an input terminal connected to the input terminal 11 and an output terminal connected to the gate of the PMOS 17 for pull down. The delay circuit 24 and the NMOS 16 constitute pull up control means. The delay circuit 25 and the PMOS 17 constitute pull down control means.

In the first embodiment shown in FIG. 1, the NAND gate 14, the NOR gate 15, the NMOS 16, and the PMOS 17 are used to control pull up and pull down of the nodes N12 and N13 by the feed back from the output signal OUT. In contrast to this, in the second embodiment, the delay circuits 24 and 25, the NMOS 16, and the PMOS 17 are used to control pull up and pull down of the nodes N12 and N13 by the delay time DT. The other configuration portion is identical to the first embodiment.

Figure 6:
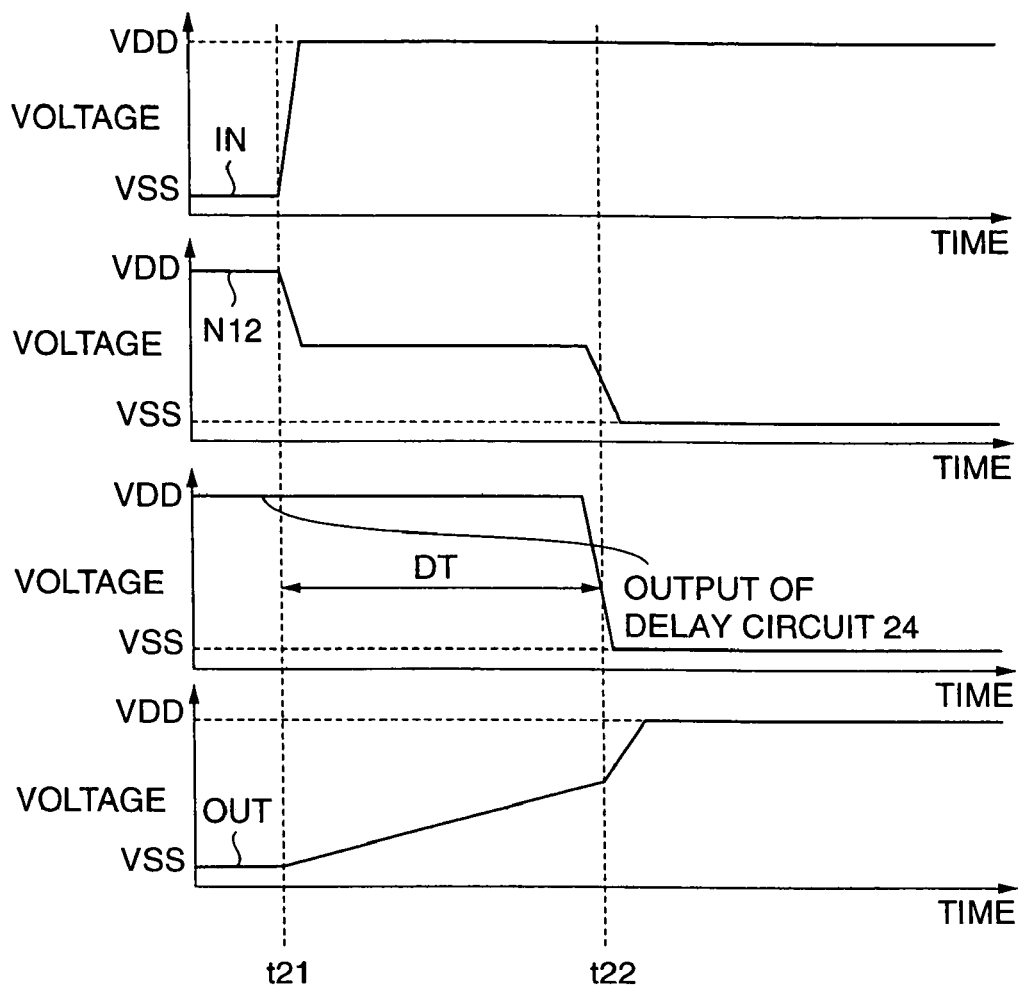
FIG. 6 is a voltage waveform diagram showing operation of FIG. 5.

FIG. 6 is a voltage waveform diagram showing operation of FIG. 5.

For example, when the input signal IN rises from the "L" level (=VSS) to the "H" level (=VDD) at time t21, the output side nodes N12 and N13 of the inverters 12 and 13 fall down to the "L" level and the PMOS 18 becomes the ON state and the NMOS 19 becomes the OFF state. When the output side node N12 of the inverter 12 falls down to the "L" level, since the delay time DT of the delay circuit 24 is present, the output voltage of the delay circuit 24 is still at the "H" level and the NMOS 16 for pull up is in the ON state. Accordingly, the voltage divided by the inverter 12 and the NMOS 16 becomes voltage of the output side node N12 of the inverter 12. The PMOS 18 supplied with this divided voltage has a drive capacity made smaller and the voltage of the output signal OUT slowly rises up to the "H" level via the PMOS 18.

At time t22 after the time lapse of the delay time DT from the time t21, the output voltage of the delay circuit 24 falls down to the "L" level. Accordingly, the NMOS 16 becomes the OFF state and the voltage of the output side node N12 of the inverter 12 becomes completely "L" level. Thus, the PMOS 18 has a large drive capacity and the voltage of the output signal OUT rapidly rises via the PMOS 18 up to the "H" level (=VDD).

Moreover, when the output signal IN falls from the "H" level down to the "L" level, the output side nodes N12 and N13 of the inverters 12 and 13 rise up to the "H" level and the PMOS 18 becomes the OFF state and the NMOS 19 becomes the ON state. When the output side node N13 of the inverter 13 rises up to the "H" level, the output voltage of the delay circuit 25 is still at the "L" level by the delay time DT of the delay circuit 25 and the PMOS for pull down is in the ON state. Accordingly, the voltage divided by the inverter 13 and the PMOS 17 becomes voltage of the output side node N13 of the inverter 13. The NMOS 19 supplied with this divided voltage has a drive capacity made smaller and voltage of the output signal OUT slowly falls down to the "L" level via the NMOS 19.

Next, when the output voltage of the delay circuit 25 becomes "H" level with delay of the delay time DT, the PMOS 17 becomes the OFF state and voltage of the output side node N13 of the inverter 13 also becomes completely "H" level. Thus, the drive capacity of the NMOS 19 becomes large and voltage of the output signal OUT rapidly falls down via the NMOS 19 completely to the "L" level (=VSS).

In this second embodiment, like in the first embodiment, it is possible to make the change of the output signal OUT at a low speed and prevent through current flowing in the PMOS 18 and the NMOS 19. Thus, it is possible to reduce the power consumption and noise while maintaining the DC characteristic of the conventional output buffer circuit. Moreover, in this embodiment, since pull up and pull down of the output side nodes N12 and N13 of the inverters 12 and 13 are controlled by the delay time DT of the delay circuits 24 and 25, it is possible to control the drive capacity of the PMOS 18 and the NMOS 19 without being affected by voltage of the output signal OUT and it becomes easy to design the circuit.

Figure 7:
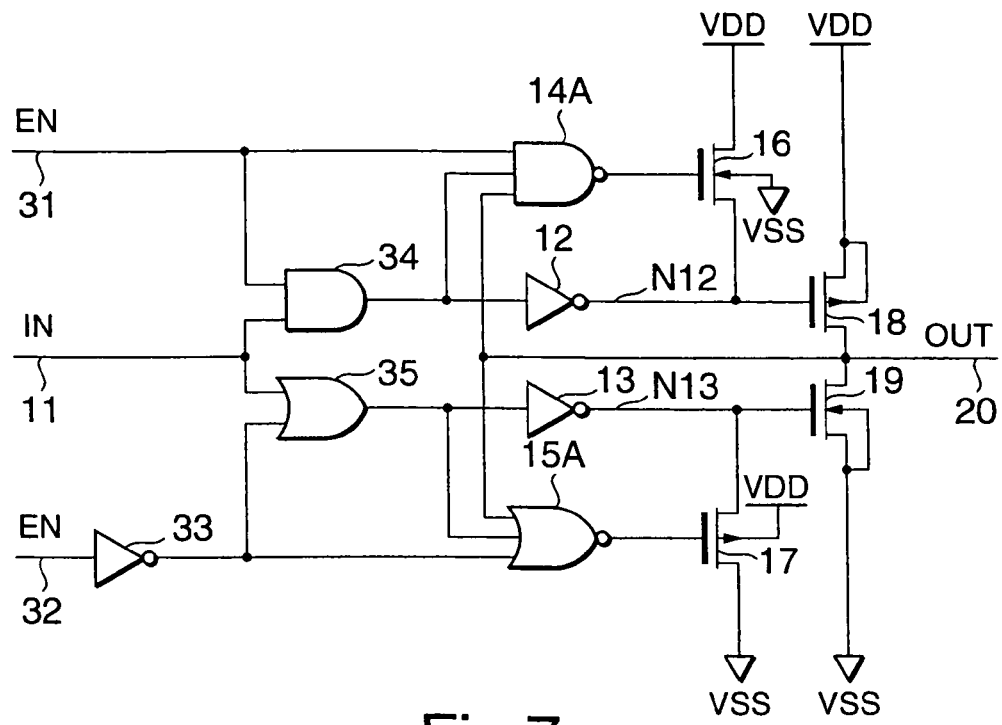
FIG. 7 is a circuit diagram of a 3-state type output buffer circuit according to a third embodiment of the present invention.

FIG. 7 a circuit diagram showing a 3-state type output buffer circuit according to a third embodiment of the present invention. Like components as in the first embodiment are denoted by like reference symbols.

This 3-state type output buffer circuit is constituted, for example, by a CMOS IC. A gate circuit is provided at the input side of the output buffer circuit of FIG. 1 and when an enable signal EN is at "L" level for example, the output terminal 20 becomes a high impedance state.

The gate circuit includes input terminals 31 and 32 for inputting the enable signal EN, an inverter 33, a 2-input AND gate 34, and a 2-input OR gate 35. Moreover, the 2-input NAND gate 14 in FIG. 1 is replaced by a 3-input NAND gate 14A, and the 2-input NOR gate 15 in FIG. 1 is replaced by a 3-input NOR gate 15A.

The input terminal 31 and the input terminal 11 are connected to an input terminal of the AND gate 34 whose output terminal is connected to an input terminal of the inverter 12. The input terminal 32 is connected to an input terminal of the inverter 33 and the output terminal of the inverter 33 and the input terminal 11 are connected to the input terminal of the OR gate 35 whose output terminal is connected to an input terminal of the inverter 13. The input terminal 31, the output terminal of the AND gate 34, and the output terminal 20 are connected to the input terminal of the NAND gate 14A, and the output terminal of this NAND gate 14A is connected to the gate of the NMOS 16 for pull up. The output terminal of the inverter 33, the output terminal of the OR gate 35,.and the output terminal 20 are connected to the input terminal of the NOR gate 15A and the output terminal of this NOR gate 15A is connected to the gate of the PMOS 17 for pull down. The other configuration portion is identical to the output buffer circuit of FIG. 1.

For example, when the enable signal EN supplied to the input terminals 31 and 32 is made "H" level, the AND gate 34, the OR gate 35, the NAND gate 14A, and the NOR gate 15A are opened. Then, the input signal IN supplied to the input terminal 11 is transmitted via the AND gate 34 to the inverter 12 and the NAND gate 14A, and via the OR gate 35 to the inverter 13 to the NOR gate 15A. Accordingly, like in the output buffer circuit of FIG. 1, when the voltage of the input signal IN falls from the "H" level down to the "L" level, voltage of the output signal OUT also falls from the "H" level down to the "L" level, and when the voltage of the input signal IN rises from the "L" level up to the "H" level, the voltage of the output signal OUT also rises from the "L" level up to the "H" level. That is, when the enable signal EN is at "H" level, operation identical to that of the output buffer circuit of FIG. 1 is performed.

Moreover, when the enable signal EN is at "L" level, the AND gate 34, the OR gate 35, the NAND gate 14A, and the NOR gate 15A are closed; output voltage of the AND gate 34 is fixed to "L" level; output voltage of the OR gate 35 is fixed to "H" level; output voltage of the NAND gate 14A is fixed to "H" level; and output voltage of the NOR gate 15A is fixed to "L" level. Accordingly, the output side node N12 of the inverter 12 is fixed to "H" level and the output side node N13 of the inverter 13 is fixed to "L" level. The "H" level output voltage of the NAND gate 14A makes the NMOS 16 in the ON state and the "L" level output voltage of the NOR gate 15A makes the PMOS 17 in the ON state. Accordingly, the node N12 is pulled up to the "H" level and the node N13 is pulled down to the "L" level. The PMOS 18 and NMOS 19 become the OFF state and the output terminal 20 becomes a Hiz state.

In this embodiment, it is possible to make the output terminal 20 in the Hiz state by the enable signal EN. Accordingly, besides the effects of the first embodiment, it is possible to obtain the 3-state type that improves usage.

Figure 8:
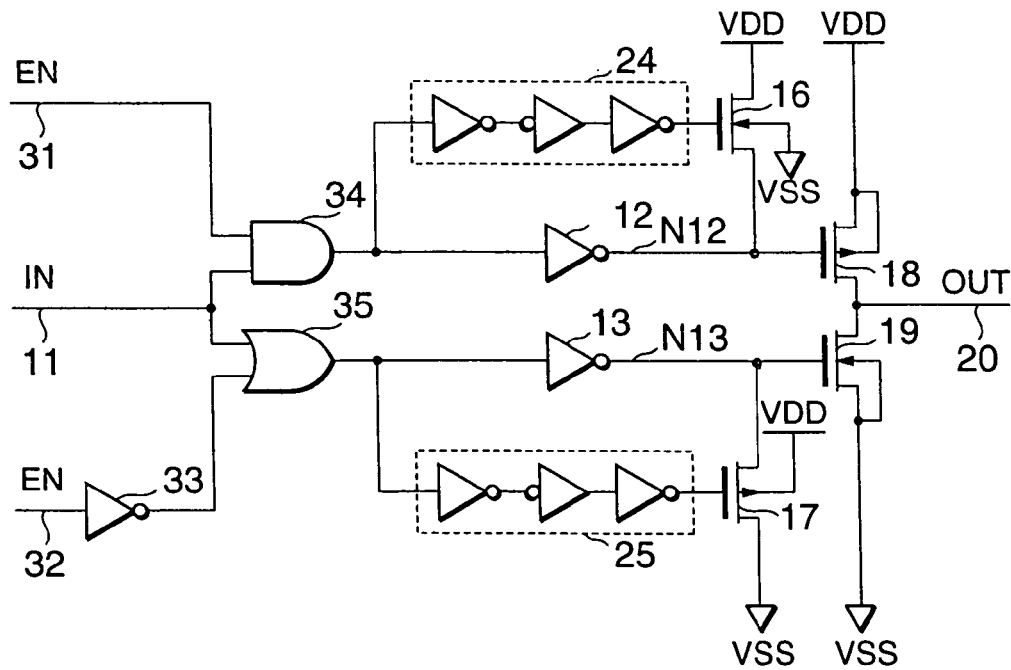
FIG. 8 is a circuit diagram of a 3-state type output buffer circuit according to a fourth embodiment of the present Invention.

FIG. 8 is a circuit diagram showing a 3-state type output buffer circuit according to a fourth embodiment of the present invention. Like components as in the second embodiment of FIG. 5 and the third embodiment of FIG. 7 are denoted by like reference symbols.

This 3-state type output buffer circuit is constituted, for example, by a CMOS IC. At the input side of the output buffer circuit of FIG. 7, a gate circuit consisting of input terminals 31 and 32 of FIG. 7, the AND gate 34, and the OR gate 35 is provided and the output terminal 20 becomes a high impedance state when the enable signal EN is at "L" level for example.

The input terminal 31 supplied with the enable signal EN and the input terminal 11 supplied with the input signal IN are connected to the input terminal of the AND gate 34 and the output terminal of this AND gate 34 is connected to the input terminal of the inverter 12 and the input terminal of the delay circuit 24. The input terminal 32 supplied with the enable signal EN is connected to the input terminal of the inverter 33. The output terminal of the inverter 33 and the input terminal 11 are connected to the input terminal of the OR gate 35, and the output terminal of this OR gate 35 is connected to the input terminal of the inverter 13 and the input terminal of the delay circuit 25. The other configuration portion is identical to the output buffer circuit of FIG. 5.

For example, when the enable signal EN supplied to the input terminals 31 and 32 is at "H" level, the AND gate 34 and the OR gate 35 are opened and the input signal IN supplied from the input terminal 11 is transmitted via the AND gate 34 to the inverter 12 and the delay circuit 24 and via the OR gate 35 to the inverter 13 and the delay circuit 25. Thus, operation identical to the output buffer circuit FIG. 5 is performed.

Moreover, when the enable signal EN is at "L" level, the AND gate 34 and the OR gate 35 are closed; the output terminal of this AND gate 34 is fixed to "L" level; and the output terminal of the OR gate is fixed to "H" level. Accordingly, the output side node N12 of the inverter 12 is fixed to "H" level and the output side node N13 of the inverter 13 is fixed to "L" level, the PMOS 18 and NMOS 19 become the OFF state, and the output terminal 20 becomes the Hiz state.

In this embodiment, it is possible to make the output terminal 20 at the high impedance state by controlling the enable signal EN. Accordingly, besides the effects obtained by the second embodiment, it is possible to obtain a 3-state type that improves usage.

Figure 9:
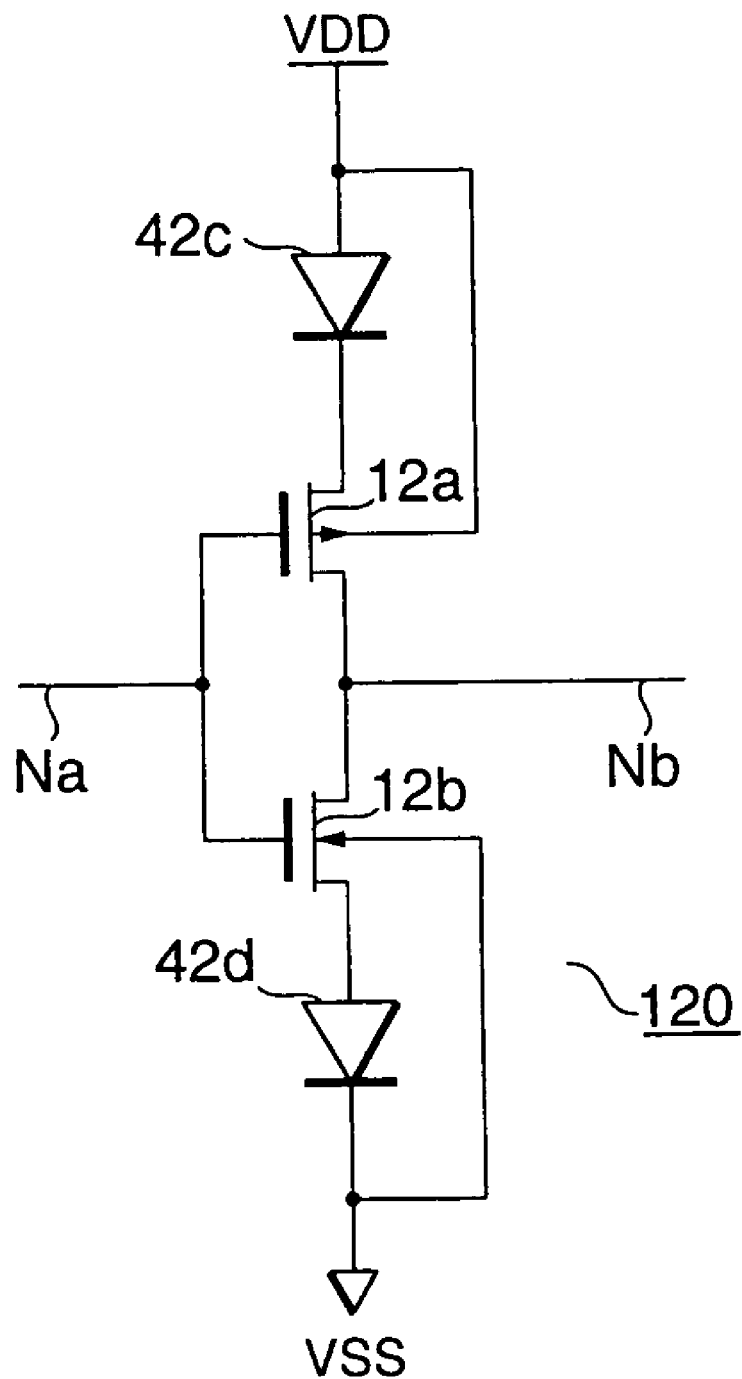
FIG. 9 shows a fifth embodiment of the present invention showing another configuration example of the inverter in FIG. 1.

FIG. 9 shows a fifth embodiment of the present invention. The inverter 12 in FIG. 1 is replaced by an inverter of another configuration. Like components as in the first embodiment of FIG. 2 are denoted by like reference symbols.

In this inverter 120, the diode-connected NMOS 12c of FIG. 2 is replaced by a first diode 42c, and the diode-connected PMOS 12d of FIG. 2 is replaced by a second diode 42d. The diode 42c is connected between the power source potential VDD node and the source of the PMOS 12a in the forward direction. The diode 42d is connected between the source of the NMOS 12b and the ground potential VSS node in the forward direction. The other configuration portion is identical to the circuit of FIG. 2.

For example, it is assumed that the voltage fall of the diodes 42c and 42d is VTdio. In the inverter 120 of the present embodiment, the diodes 42c and 42d operate almost in the same way as the NMOS 12c and PMOS 12d in FIG. 2. Accordingly, when the input voltage is supplied to the input node Na, the output voltage of the output node Nb slowly changes in a voltage range between the ground potential VSS and the voltage I VTdio I and a voltage range between the power source potential VDD and a voltage (VDD–I VTdio I). Consequently, the voltage of the output signal OUT of FIG. 1 also changes at a low speed.

In this embodiment, like the inverter 12 (or 13) of the first embodiment of FIG. 2, it is possible to slowly change the voltage of the output signal OUT. For this, like the inverter 12 (or 13) in FIG. 2, it is possible to prevent generation of the output waveform overshoot and undershoot and to prevent generation of power source noise due to output current.

The present invention is not limited to the aforementioned embodiments but may be modified in various ways. For example, modifications (i) to (iv) as follows can be performed.

(i) In the inverter of FIG. 2 and FIG. 9, the PMOS may be replaced by an NMOS and the NMOS may be replaced by a PMOS. Corresponding to this, the power source potential VDD and the ground potential VSS may have reverse polarity. Alternatively, the PMOS and the NMOS may be constituted by transistors such as bipolar transistors.

(ii) The pull up control means and the pull down control means of FIG. 1 and FIG. 2 may be constituted by other gate circuit or transistor.

(iii) The pull up control means and the pull down control means of FIG. 5 and FIG. 8 may be constituted by a delay circuit and a transistor of other configuration.

(iv) The PMOS 18 and the NMOS 19 for output in the embodiment may be replaced by an NMOS and a PMOS, respectively, by changing the polarity of the power source potential. Moreover, these may also be constituted by other output transistors such as bipolar transistors.

What is claimed is:

1. An output buffer circuit comprising:
an input terminal for receiving an input signal;
an output terminal for outputting an output signal;
a first inverter connected to the input terminal, the first inverter outputting a first signal having a slow rise up and fall down characteristic;
a second inverter connected to the input terminal, the second inverter outputting a second signal having the slow rise up and fall down characteristic;
a pull up control circuit connected to the input terminal, the pull up control circuit including a delay circuit that is connected to the input terminal and that has third inverters connected in series that provide a delayed input signal,
the pull up control circuit pulling up a voltage of the first signal under control of the delayed input signal during a predetermined time from a time when the input signal is changed from "L" level to "H" level;
a pull down control circuit connected to the input terminal, the pull down control circuit pulling down a voltage of the second signal during a predetermined time from a time when the input signal is changed from "H" level to "L" level;
a first output transistor having a source connected to a first power source potential node, a drain connected to the output terminal and a gate connected to the first inverter so as to receive the first signal; and
a second output transistor having a source connected to a second power source potential node, a drain connected to the output terminal and a gate connected to the second inverter so as to receive the second signal.

2. An output buffer circuit comprising:
an input terminal for receiving an input signal;
an output terminal for outputting an output signal;
a first inverter connected to the input terminal, the first inverter outputting a first signal having a slow rise up and fall down characteristic;
a second inverter connected to the input terminal, the second inverter outputting a second signal having the slow rise up and fall down characteristic;
a pull up control circuit connected to the input terminal, the pull up control circuit pulling up a voltage of the first signal during a predetermined time from a time when the input signal is changed from "L" level to "H" level;
a pull down control circuit connected to the input terminal, the pull down control circuit pulling down a voltage of the second signal during a predetermined time from a time when the input signal is changed from "H" level to "L" level;
a first output transistor having a source connected to a first power source potential node, a drain connected to the output terminal and a gate connected to the first inverter so as to receive the first signal; and
a second output transistor having a source connected to a second power source potential node, a drain connected to the output terminal and a gate connected to the second inverter so as to receive the second signal,
wherein each of the first and second inverters comprises
an inverter input terminal,
an inverter output terminal,
a first inverter transistor of a first conductivity type having a back gate connected to the second power source potential node, a first terminal, and a second terminal and a gate connected together with the first power source potential node,
a second inverter transistor of a second conductivity type having a back gate connected to the first power source potential node, a first terminal connected to the first terminal of the first inverter transistor, a second terminal connected to the inverter output terminal and a gate connected to the inverter input terminal,
a third inverter transistor of the second conductivity type having a back gate connected to the first power source potential node, a first terminal, and a second terminal and a gate connected together with the second power source potential node, and
a fourth inverter transistor of the first conductivity type having a back gate connected to the second power source potential node, a first terminal connected to the first terminal of the third inverter transistor, a second terminal connected to the inverter output terminal and a gate connected to the inverter input terminal.

3. An output buffer circuit comprising:
an input terminal for receiving an input signal;
an output terminal for outputting an output signal;
a first inverter connected to the input terminal, the first inverter outputting a first signal having a slow rise up and fall down characteristic;

a second inverter connected to the input terminal, the second inverter outputting a second signal having the slow rise up and fall down characteristic;

a pull up control circuit connected to the input terminal, the pull up control circuit pulling up a voltage of the first signal during a predetermined time from a time when the input signal is changed from "L" level to "H" level;

a pull down control circuit connected to the input terminal, the pull down control circuit pulling down a voltage of the second signal during a predetermined time from a time when the input signal is changed from "H" level to "L" level;

a first output transistor having a source connected to a first power source potential node, a drain connected to the output terminal and a gate connected to the first inverter so as to receive the first signal; and a second output transistor having a source connected to a second power source potential node, a drain connected to the output terminal and a gate connected to the second inverter so as to receive the second signal, wherein each of the first and second inverters comprises
an inverter input terminal,
an inverter output terminal,
a first inverter transistor of a first conductivity type having a back gate connected to the first power source potential node, a first terminal, a second terminal connected to the inverter output terminal and a gate connected to the inverter input terminal,
a first diode connected between the first power source potential node and the first terminal of the first inverter transistor for pulling down a voltage supplied from the first power source potential node,
a second inverter transistor of a second conductivity type having a back gate connected to the second power source potential node, a first terminal, a second terminal connected to the inverter output terminal and a gate connected to the inverter input terminal, and
a second diode connected between the second power source potential node and the first terminal of the second inverter transistor for pulling down a voltage supplied from the first terminal of the second inverter transistor.

4. An output buffer circuit according to claim 3, wherein the first diode has an anode connected to the first power source potential node, and a cathode connected to the first terminal of the first inverter transistor, and wherein the second diode has a cathode connected to the second power source potential node, and an anode connected to the first terminal of the second inverter transistor.

5. An output buffer circuit according to claim 1, wherein the pull up control circuit further comprises:
a pull up transistor having a first terminal connected to the first power source potential node, a second terminal connected to an inverter output terminal of the first inverter and a gate connected to an output terminal of the delay circuit.

6. An output buffer circuit according to claim 1, wherein the pull down control circuit comprises:
a second delay circuit having an input terminal connected to the input terminal of the output buffer circuit and having fourth inverters connected in series that provide a second delayed input signal; and
a pull down transistor having a first terminal connected to the second power source potential node, a second terminal connected to an inverter output terminal of the second inverter and a gate connected to an output terminal of the second delay circuit,
wherein the pull down transistor pulls down the voltage of the second signal under control of the second delayed input signal.

7. An output buffer circuit according to claim 1, further comprising an enable gate circuit having a first input terminal connected to the input terminal of the output buffer circuit, a second input terminal connected to receive an enable signal and a pair of output terminals respectively connected to inverter input terminals of the first and second inverters.

8. An output buffer circuit according to claim 7, wherein the enable gate circuit includes,
an AND circuit having a first input terminal connected to the first input terminal of the enable gate circuit, a second input terminal connected to receive the enable signal and an output terminal connected to the inverter input terminal of the first inverter,
a fourth inverter having an input terminal connected to receive the enable signal and having an output terminal, and
an OR circuit having a first input terminal connected to the first input terminal of the enable gate circuit, a second input terminal connected to the output terminal of the fourth inverter and an output terminal connected to the inverter input terminal of the second inverter.

* * * * *